United States Patent [19]

Hed

[11] Patent Number: 5,227,756
[45] Date of Patent: Jul. 13, 1993

[54] MODULATION OF MAGNETIC FIELDS FORMED BY SOLENOIDS

[75] Inventor: Aharon Z. Hed, 12 Wagon Trail, Nashua, N.H. 03062

[73] Assignee: Aharon Zeev Hed, Nashua, N.H.

[21] Appl. No.: 746,922

[22] Filed: Aug. 19, 1991

[51] Int. Cl.$^5$ ............................................. H01F 1/00
[52] U.S. Cl. .................................... 335/216; 335/299
[58] Field of Search ................ 335/216, 299; 324/300, 324/318, 319, 320; 505/844

[56] References Cited

U.S. PATENT DOCUMENTS

| 4,905,316 | 2/1990 | Okamoto | 335/216 |
| 4,939,493 | 7/1990 | Krienin | 335/216 |
| 5,107,240 | 4/1992 | Tashiro et al. | 336/60 |

*Primary Examiner*—Lincoln Donovan
*Attorney, Agent, or Firm*—Herbert Dubno

[57] ABSTRACT

Temporal and spatial modulation of magnetic fields created around solenoids and within their hollow is effected using specially configured and movable superconducting elements as well as switchable superconducting elements.

33 Claims, 10 Drawing Sheets

MODULATION OF MAGNETIC FIELDS FORMED BY SOLENOIDS

CROSS REFERENCE TO RELATED APPLICATION

This application is related to my copending application Ser. No. 07/314,427 filed 22 Feb. 1989, now U.S. Pat. No. 5,087,610 of 11 Feb. 1992.

FIELD OF THE INVENTION

The present invention is related to a method of and an apparatus for creating unique magnetic field topologies and their spatial and temporal modulation by switchable superconducting elements as well as by the movement of specially configured superconductors so disposed as to shape the fields.

BACKGROUND OF THE INVENTION

In a recently issued patent (U.S. Pat. No. 4,996,508), the spatial and temporal control of magnetic fields within solenoids was taught. I am not aware of efforts to modify the magnetic field outside a solenoid, except for screening of such fields by using highly ferromagnetic substances which concentrate the fields within these ferromagnetic substances.

In yet another recently issued patent (U.S. Pat. No. 5,010,311) the general principle of using switchable superconducting elements to obtain modulation of magnetic fields in the vicinity of said elements was taught. In the aforementioned copending application (Ser. No. 07/314,427) entitled "Switchable Superconducting Elements and Pixels Arrays" modulation of magnetic fields on a point by point basis was described.

The present invention provides for modulation of magnetic fields outside solenoids as well as additional means for obtaining new magnetic field topologies within solenoids and controlling these by mechanical and electronic means.

Prior art design of a superconducting magnetic energy storage (SMES) system has been limited by the hoop stress on the solenoid windings induced by the interaction between the magnetic field generated within the solenoid and the current in the solenoid windings which can be alleviated by the invention.

OBJECTS OF THE INVENTION

It is an object of the instant invention to provide solenoids with external magnetic fields which are uniquely shaped, and whose shape can be controlled either mechanically or electronically.

It is another object of the instant invention to provide for hoop stress reduction in the windings of solenoids thereby facilitating SMES systems.

It is yet another object of the instant invention to provide unique magnetic fields within solenoids that can be modulated spatially and temporally.

SUMMARY OF THE INVENTION

These objects can be attained in a method of producing magnetic fields of predetermined topology which comprises the steps of:

(a) providing a coil having a predetermined coil length and formed by at least one layer of a multiplicity of generally helical turns of a conductor capable upon energization of generating a solenoid magnetic field directed axially within the coil and having an outer magnetic field component surrounding the coil;

(b) shaping the outer magnetic field component at least in part by:

spacedly surrounding the coil with an annular superconductor positioned, upon being rendered superconductive, to confine the outer magnetic field component between the superconductor and the coil, and cooling the annular superconductor to a temperature below a critical temperature $T_c$ thereof at which the annular superconductor is rendered superconductive; and (c) passing an electric current through said coil to generate said solenoid magnetic field.

Alternatively the method can comprise:

(a) providing a coil having a predetermined coil length and formed by at least one layer of a multiplicity of generally helical turns of a conductor and capable upon energization of generate a magnetic field directed axially within the coil;

(b) shaping the magnetic field at least in part by:

disposing within the coil an annular superconductor positioned, upon being rendered superconductive, to confine the magnetic field between the superconductor and the coil, forming the annular superconductor with at least one magnetically permeable zone extending over a limited portion of a circumference of the annular superconductor to shape an inwardly directed bulge of the magnetic field, and cooling the annular superconductor to a temperature below a critical temperature $T_c$ thereof at which the annular superconductor is rendered superconductive; and (c) passing an electric current through the coil to generate the magnetic field.

The apparatus can comprise:

a coil having a predetermined coil length and formed by at least one layer of a multiplicity of generally helical turns of a conductor;

means for passing an electric current through the coil to generate a solenoid magnetic field directed axially within the coil and having an outer magnetic field component surrounding the coil;

an annular superconductor spacedly surrounding the coil and positioned, upon being rendered superconductive, to confine the outer magnetic field component between the superconductor and the coil; and means for cooling the annular superconductor to a temperature below a critical temperature $T_c$ thereof at which the annular superconductor is rendered superconductive.

The solenoid of the invention is thus enclosed within a superconducting cylindrical structure which is concentric, or at least generally concentric with the solenoid.

In another embodiment, the enclosing cylinder may be composed of two adjacent superconducting cylinders having a gap between them. In yet another embodiment, the enclosing superconducting cylinder may have at least one perforation on at least one of its sides.

In yet another embodiment magnetically permeable zones may be created from concentric quenchable superconducting elements so as to vary the size of the perforation by quenching said elements from the superconducting state to the normal state in an appropriate sequence.

In yet another embodiment the enclosing cylinder consists of one or more annuli of quenchable superconductors and the modulation of the solenoids external field occurs by switching one or more of said annuli in and out of the superconducting state.

In yet another embodiment of the invention, the field within a solenoid is modified and temporally modulated by using similar superconducting structures inserted concentrically within the hollow space formed by the solenoid's windings.

According to a feature of the invention, the method comprises the step of mechanically bracing the external annular superconductor against outwardly directed force whereby the outer magnetic field component, compressed between the annular superconductor and coil, virtually transfers the hoop stress to the annular superconductor and the mechanical bracing.

By compressing the flux I can equilibrate the inward and outward forces on the winding when I bring the flux at the winding outer surface to be equal and opposite the flux at the inner surface of the winding. The field applied to the bracing superconductor interacts with the virtual eddy currents thereof (responsible for the Meissner effect) for transfer of the hoop stress.

The annular superconductor can define a magnetic-field-permeable zone between opposite axial ends of the coil, thereby creating an outward bulge in the outer magnetic field component, this bulge being shiftable by mechanical displacement of the annular superconductor. The mechanical displacement can involve moving the annular superconductor axially along the coil.

The bulge may be defined between two annular superconductors which may be moved jointly (in tandem) to move the bulge or which can be moved relatively to alter the morphology thereof. Alternatively the magnetic-field-permeable zone may be formed by selectively quenching superconductivity of a plurality of superconductor elements provided in the region in which the bulge is to be formed.

BRIEF DESCRIPTION OF THE DRAWING

The above and other objects, features and advantages of the instant invention will become more readily apparent from the following description, reference being made to the accompanying highly diagrammatic drawing in which.

SPECIFIC DESCRIPTION

A. Compression of The External Magnetic Field Formed Around Solenoids

Figure 1:
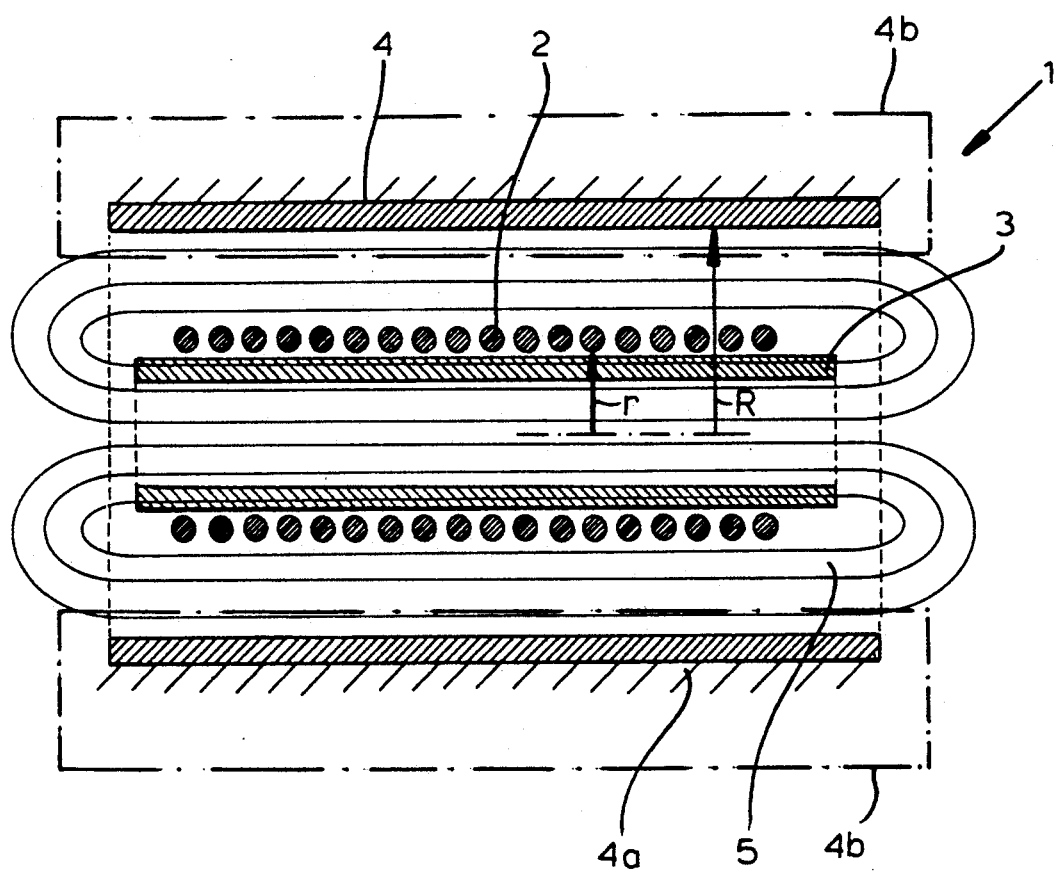
FIG. 1 is a cross section through a solenoid of the instant invention consisting of a normal solenoid enclosed concentrically within a solid cylinder made of superconductive material.

A compound solenoid 1 is shown in FIG. 1 with current carrying windings 2 on support structure 3. This solenoid is enclosed within a well braced hollow superconducting cylinder 4. The external bracing is represented at 4a. For the sake of simplicity I do not show here and in subsequent figures any of the cryogenic dewars that would usually enclose at least the superconducting cylindrical structures.

The cooling means for reducing the temperature of the elements 4, etc. to a temperature below the critical temperature $T_c$ at which the element is superconducting is represented generally at 4b. Furthermore, the current bearing windings of the solenoid could themselves be made of superconducting material and thus would require their own or a joint cryogenic system (with the superconducting cylinder). Such cryogenic systems are well known in the prior art and thus not shown in detail herein.

It should be understood that the preferred embodiment of such dewars would utilize materials that have magnetic permeability very close to 1, like styrofoams for insulation and nonmagnetic stainless steel for structural elements.

Consider the situation when the superconducting cylinder 4 is cooled under its critical temperature, prior to starting a current flowing through the windings, and the current then begins flowing in the winding. As a result of the current a magnetic field will be established. This field will be homogeneous within the solenoid, generally as in normal solenoids. The magnetic flux lines 5, outside the solenoid, which usually would spread outside the space of the solenoid (with a field intensity declining generally with the cubic power of the distance from the external surface of the solenoid), will however, be compressed between the windings 2 and the superconducting cylinder 4 as illustrated in FIG. 1. This is due to the Meissner effect within the bracing superconducting cylinder.

In principle, if the superconducting cylinder is assumed to be in a perfect diamagnetic state, or at relatively low overall field strength, one could obtain in the space between the outer superconducting cylinder and the windings a field equal in intensity to the field within the solenoid (but in the opposite direction). This would occur, if the cross sectional area of the space between the superconducting cylinder and the solenoid winding equals that of the solenoid hollow. Disregarding field penetration effects and the thickness of the windings, this occurs when:

$$R = 2^{\frac{1}{2}} r$$

where r is the radius of the windings and R the inner radius of the bracing superconductor cylinder (see FIG. 1).

Larger and smaller fields between the external superconducting cylinder and the windings can be obtained by choosing appropriately the ratio of the cross sectional area between the outer superconducting cylinder and the windings to the solenoid's hollow cross sectional area. This is simply because all the magnetic flux lines that emanate from the solenoid must converge in the space between the solenoid winding and the outer superconducting cylinder.

This feature is the basis for the system for reducing the hoop stresses on the windings of a solenoid. As is well known, the hoop stresses on solenoid's winding arise due to Lorentz forces acting on the windings through which the current passes. In traditional solenoids the magnetic field on the windings at the inner solenoid hollow surface is the field within the solenoid. At the winding outer surface, the magnetic field is in the inverse direction and has an absolute value much smaller than at the inner surface. This describes well the field distribution on windings near the center of the solenoid where edge effects are minimal.

Figure 2B:
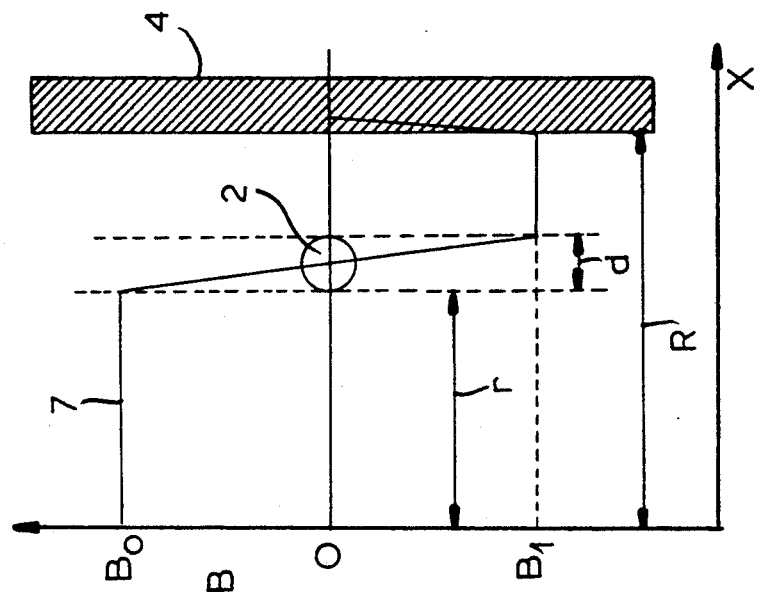
FIG. 2B is a similar diagram which shows the impact on the magnetic flux density of enclosing said solenoid within a cylindrical structure made of a superconductor.
Figure 2A:
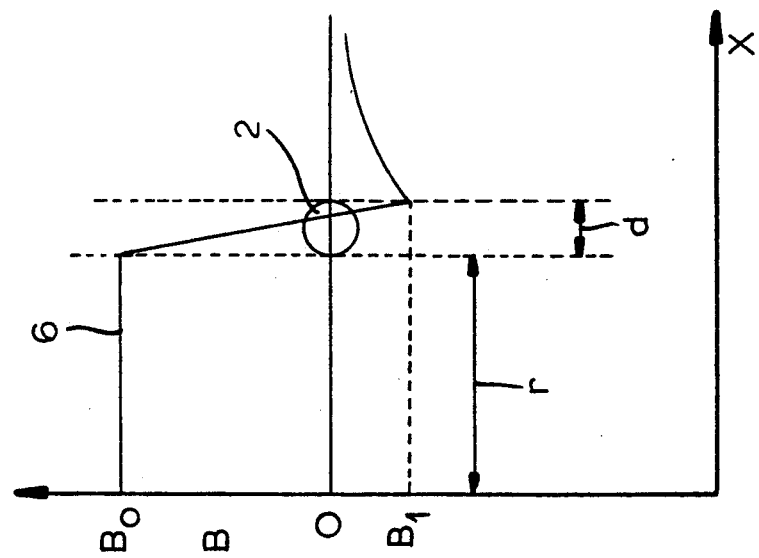
FIG. 2A is a diagram presenting the magnetic flux density along a radial ray of the solenoid from the solenoid's center to a point outside the solenoid.

This is demonstrated in FIG. 2A, where the magnetic induction is shown as a function of the distance X from the center of the solenoid (curve 6). I show a cross section through a single winding 2 having a diameter d, at the center of a solenoid of diameter r. Only the component of the magnetic induction which is perpendicular to the direction of the current inside the windings (in or out of the sheet of drawing of FIG. 1) is relevant.

The decrease of the magnetic induction outside the solenoid obeys a complex cubic law. The magnetic induction inside the solenoid hollow is constant at $B_0$ and starts to decrease toward zero within the winding. It can be shown that within the winding the flux density decrease linearly as shown in FIG. 2A. The flux density reaches zero somewhere within the winding but not at its center but closer toward the outer surface of the winding as shown in FIG. 2A. At the outer surface of the winding 2, the flux density is in the inverse direction and its absolute value is $B_1$.

In the case of normal solenoids, the absolute value of $B_0$ is much larger than the absolute value of $B_1$, and thus the zero point is almost on the outer surface of the winding. The Lorentz force at every point is proportional to the vectorial product of the flux density and the current ($B \times J$). Integration of this product over the winding will yield the well known hoop stress pressure proportional to $B_0^2$. This is because the inward forces on the winding due to the outside field $B_1$ are negligible relative to the outward forces due to $B_0$.

In FIG. 2B I show the magnetic flux density when $B_1$ is artificially increased in absolute value to $B_0$ (curve 7), by the use of the external superconducting cylinder 4 shown in FIG. 1. I choose a ratio of the cross sectional area of the inner hollow of the solenoid and the cross sectional area of the space between the windings and the external cylinder to be 1, so that the absolute values of $B_0$ and $B_1$ are equal. In other words, R, the inner radius of the bracing superconducting cylinder 4, is somewhat smaller than 1.414r to allow for the winding diameter.

Under these conditions, the magnetic flux density is nil at the center of the winding and symmetrical, thus integration of $B \times J$ on the winding will yield zero. In practice, one cannot organize the windings and the superconducting cylinder to sufficient accuracy to cancel the Lorentz forces on the windings completely, particularly in solenoids of finite length. It will be clear, however, to a person skilled in the art that drastic reduction of the hoop stresses on the windings will occur when using the outer bracing superconducting cylinder.

It should be understood that the hoop stresses have not disappeared, but have only been shifted to the outer superconducting cylinder. The advantage of such a shifting is in the fact that it is much easier to withstand such high pressures on a solid body, like the superconducting cylinder, than on individual, usually fragile, windings. Furthermore, hoop stresses induced deformation in the superconducting cylinder involves much smaller electrical losses than in the current carrying windings inside the magnetic field.

The hoop stresses on a solenoid windings are drastically reduced and in effect transferred to another outer solid structure, namely, the braced superconducting cylinder.

In practical embodiments of hoop stress reduction devices as described in FIG. 1, the solenoid and the bracing superconductor should be fastened to each other, e.g. rigidly, (with nonmagnetic elements) to prevent small inhomogeneities in flux distribution from causing relative motion of the two elements along their common axis.

In FIG. 1, moreover, there is homogenization of end fields of a solenoid. In the prior art, the field within a solenoid cease to be homogeneous near the ends of a solenoid (a typical figure of merit is that the field is still relatively homogeneous in the central region $1 - 2r$ when 1 is the solenoid length and r its radius). In order to extend the range of homogeneous field at the ends of a solenoid, unique shaping of the windings (actually a gradual decrease in the winding diameter) is sometimes practiced. In the instant invention I achieve the same goal by using an external superconducting cylinder 4 in FIG. 1 whose length is somewhat greater than the solenoid length.

B. External Magnetic Field Pinch in Solenoids

Figure 3:
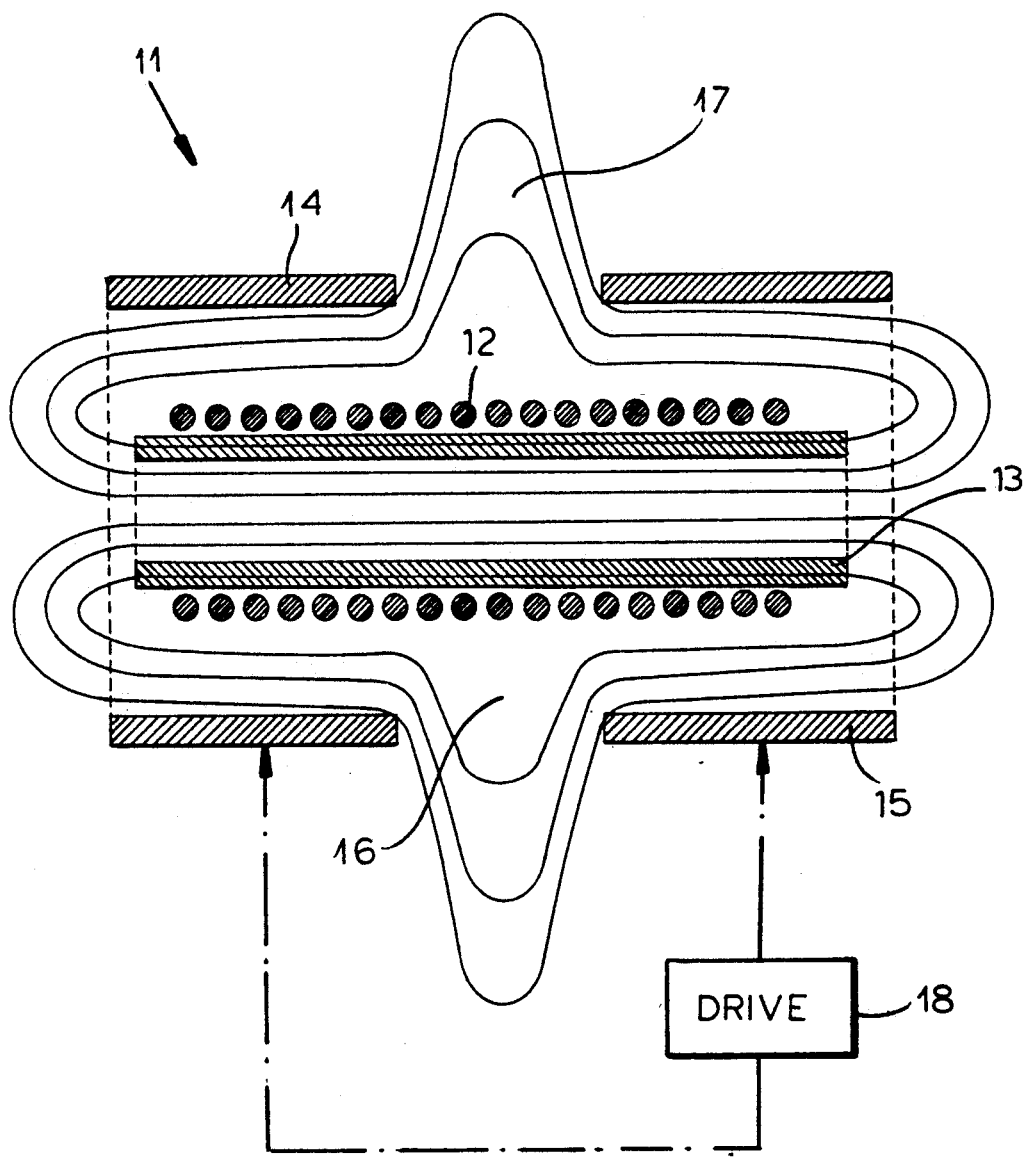
FIG. 3 is a cross section through another embodiment of the instant invention consisting of a normal solenoid enclosed concentrically within a segmented solid cylinder made of superconductive material.

The external superconducting cylinder can be cut into two parts along a line perpendicular to the cylinder axis, thereby creating a gap between the two adjacent cylinders thus formed. This configuration is illustrated in FIG. 3, where the specially configured solenoid 11 has winding 12 on a support structure 13, and the bracing superconducting cylinder is segmented into two adjacent cylinders 14 and 15, with a gap 16 between them. As can be seen, the magnetic flux lines 17 which were compressed between the superconducting cylinder and the solenoid winding are squeezed out in the breach 16 created between the two cylindrical structures.

This forms a magnetic field pinch outside of the solenoid which has the general form of a radial protrusion. The magnetic field has a general north-south orientation on one side of the protrusion and a south-north orientation on the other side. Near the bisecting line of the breach, the magnetic field turns rapidly and on the bisecting line it is in the direction of the solenoid's axis with a orientation inverse to the field within the solenoid.

It should be self evident that if the two superconducting cylinders are fastened to a driving mechanism, e.g. the drive 18 shown in FIG. 3, capable of moving the cylinders in a direction coaxial with the solenoid axis, the magnetic field pinch can be made to move with the movement of the breach between the two superconducting cylinders 14 and 15. This temporal modulation of the field would be achieved if the two cylinders move in tandem. One can also determine that the shape of the magnetic field pinch created in the breach 16 can be modified by moving one cylinder relative to the other to increase or decrease the breach between the two cylindrical structures by the drive 18.

Thus a large variety of specific field topologies outside the solenoid can be obtained by choosing different shapes for the breach between the two cylindrical superconductors and also by appropriately shaping the lip or edge of the superconducting cylinder adjacent to the breach.

Furthermore, the gap need not necessarily be perpendicular to the solenoid axis, nor need the gap width be necessarily constant around the solenoid. Furthermore, said breach need not have a projection on any plane which is a straight line. For instance, one could conceive of a breach undulating about a slanted cross section of the superconducting cylinder, and having the undulation of variable wavelength and amplitude to create an external field excursion with a variable topology around the solenoid and generally perpendicular to it. As above, any of these field morphologies can be moved laterally, simply by the tandem movement of the two superconducting cylinders, or the form of field excursion can be changed by the movement of one cylinder relative to the other.

When using a very long solenoid, a number of these breaches can be created along the solenoid axis to obtain a plurality of field protrusions along said axis.

Furthermore, one can obtain additional morphologies which are asymmetric around the solenoid by positioning the external cylinders in a non coaxial manner with the solenoid axis, or even at small angles to the axis of the solenoid.

In summary, one can "cut" the single superconductor cylinder into a plurality of smaller cylindrical segments along a plurality of closed contours, each such contour having any conceivable shape, and at each point along such contours having a gap whose width can vary with the position along the contour, and said gap can vary among the various gaps between the plurality of cylindrical shapes formed.

The principles of moving the unique magnetic field pinches of the instant invention by mechanical means as taught above, would apply as well to a plurality of magnetic field pinches.

Static magnetic field pinches can be used to form magnetic journal bearings, i.e. an outer sleeve (superconducting or permanently magnetic) can be journaled on such pinches.

The spatial and temporal modulation of the magnetic field bulges may be used to control the flow of a ferrofluid through a duct within which the solenoid assembly of the invention is provided and through the ferrofluid passes around the solenoid assembly.

The movement can be provided by rotating the cylinders on a simple screwthread. This movement can be in tandem, namely the plurality of cylindrical structures move together and thus the gaps are constant and the magnetic field pinch topology is constant, or the cylinders can be made to move independently, thus controlling both the magnetic-field pinch position and morphology.

C. Spatial and Temporal Electronic Modulation of External Magnetic Field Pinches around Solenoids It should be clear that the technique taught in U.S. Pat. No. 4,996,508, using switchable superconducting annuli to modulate the field inside a solenoid, can be equally effective in the modulation of the field outside the solenoid. In lieu of solid superconducting cylinders as described above, one can simply build overlapping switchable superconducting annuli to form the bulge zone and obtain similar results.

In a analogy with the same cited patent, one can have a plurality of pinches and these pinches can be made to move relative to the axis of the solenoid by the judicious sequential quenching of appropriate annuli, as described in greater detail with reference to FIG. 4.

Figure 4:
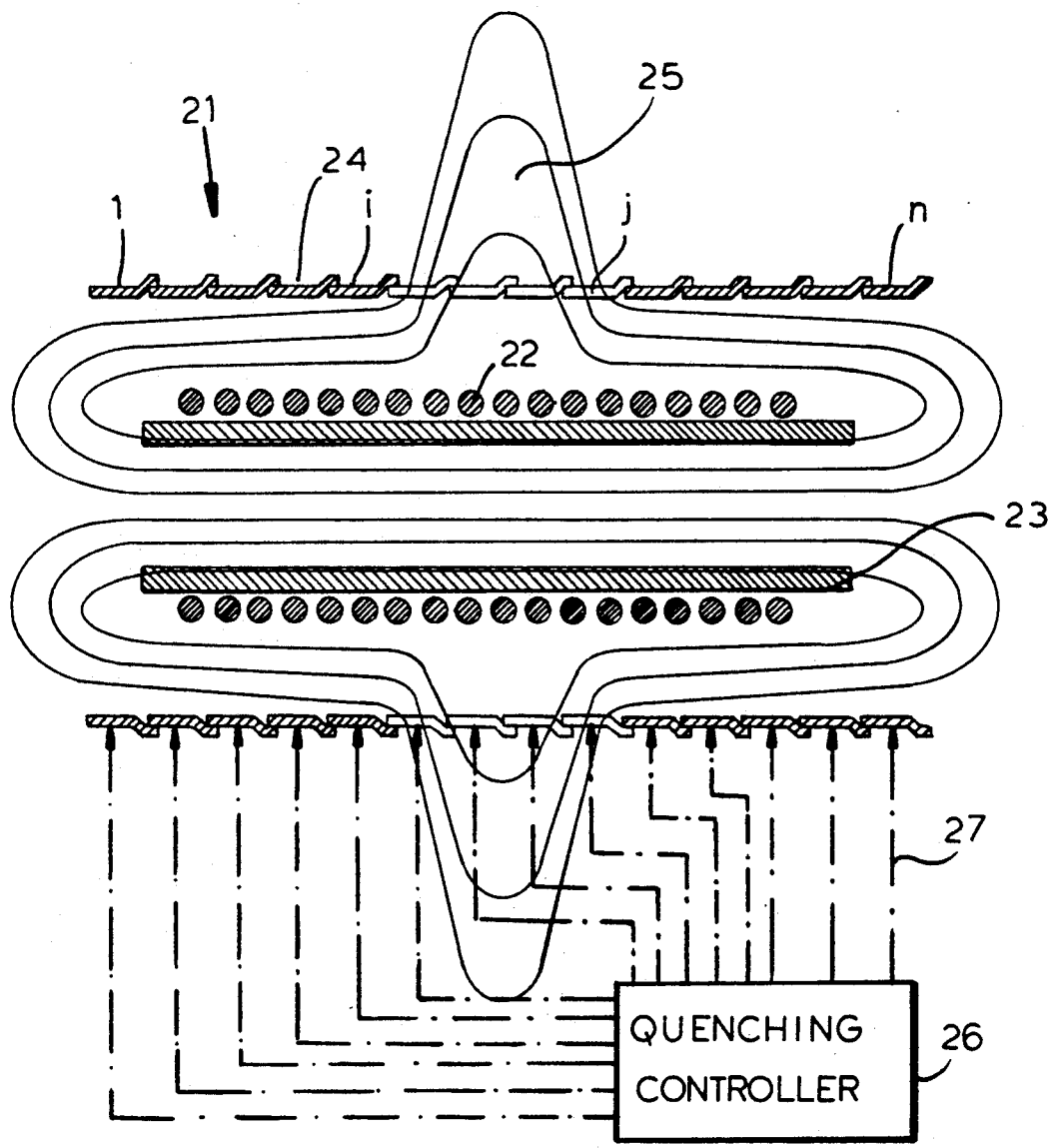
FIG. 4 is a cross section through yet another embodiment of the instant invention consisting of a normal solenoid enclosed concentrically within a cylindrical structure assembled of adjacent quenchable superconducting annuli.

In FIG. 4 I show the specially configured solenoid 21, having current carrying windings 22 wound on a cylindrical support structure 23. A plurality, n, of overlapping superconducting annuli 24, form a cylindrical structure within a support structure (not shown) that can allow for recirculation of a cooling cryogenic fluid. Each superconducting annulus can be independently quenched to its normal state by, for instance, a quenching current pulse, or a small thermal element at its base (neither the current leads nor the thermal elements are shown in detail). The quenching controller is represented diagrammatically at 26 and its connections to the respective annulus at 27.

In FIG. 4 I show the annuli I to i and j+1 to n to be in the superconducting state, while the annuli i+1 to j are quenched to the normal state. In this configuration, a magnetic field pinch protrusion is created as depicted by the field lines 25, between the annuli i and j+1, when these annuli are in the normal state.

If it is desired to narrow the pinch, an annulus, in the normal state and adjacent to a superconducting annulus, is allowed to return to the superconducting state, either by interrupting the quenching current through it, or if its temperature was raised above the critical temperature, by interrupting the heat flow from the thermal element. Similarly, broadening of the magnetic flux pinch is achieved by quenching superconducting annuli adjacent to normal annuli to create a breach of the desired width from nonsuperconducting annuli which is bound by superconducting annuli on both sides.

A given pinch configuration can be moved along the axis of the solenoid by the judicious timing of quenching and "unquenching" of superconducting annuli using the controller 26. For instance, if one wants to move the magnetic field pinch described in FIG. 4 to the left, annulus i will be quenched to the normal state and simultaneously annulus j will be returned to the superconducting state.

In some applications, the order of annuli quenching is important. When a field pinched on both sides is desired, it is usually preferred not to quench the end annuli 1 and n. In practice the end annuli are simply slightly broader and of the nonquenchable type. This assures that the magnetic flux is anchored between the superconductor and the solenoid windings.

In some other applications, one may desire to anchor the magnetic flux in a central location of the solenoid and let the flux expand near the extremities of the solenoid. Proper sequences of quenching the annuli become important and must be carried in such a way that flux is not trapped outside a newly quenched annulus. One such sequence is to quench always an annulus adjacent to an already quenched annulus which anchors the flux between it and the solenoid.

One can of course utilize hybrid methods of modulation of the field including combinations of mechanical and electronic modulation means. This can be easily achieved by connecting the quenchable superconductor structure (or alternatively, the solenoid winding bearing structure) to a mechanical drive, and modulate the magnetic pinch width electronically and the pinch position along the solenoid axis mechanically.

D. Formation of Conical Field Protrusion outside A Solenoid

Figure 5:
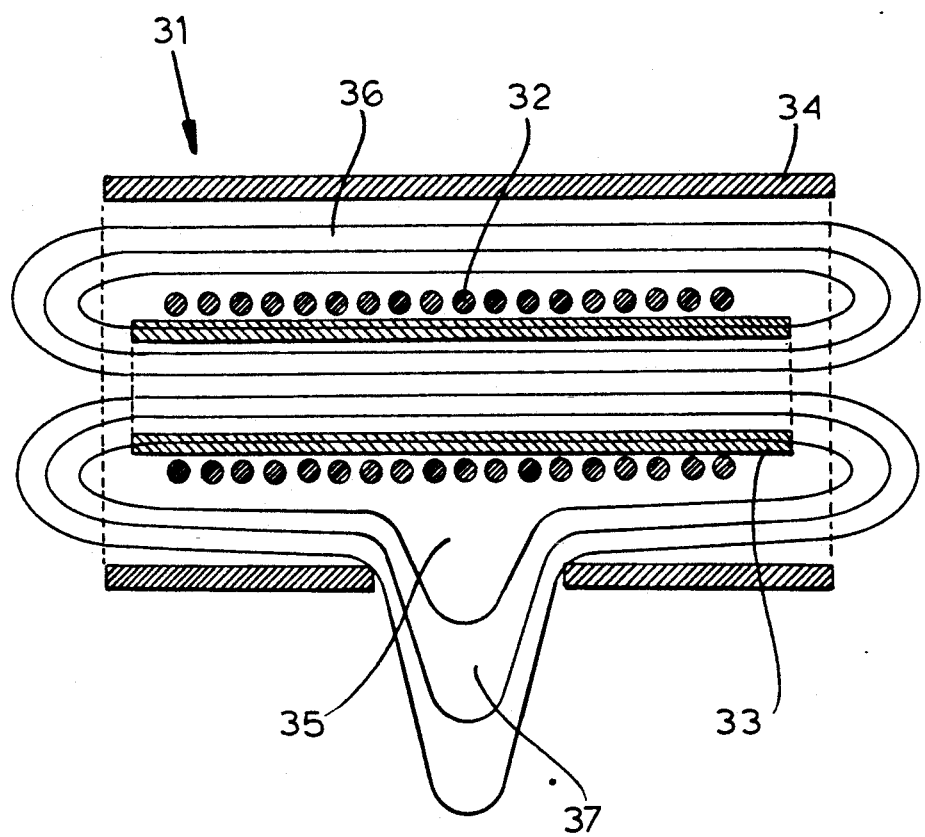
FIG. 5 is a cross section through yet another embodiment of the instant invention consisting of a normal solenoid enclosed concentrically within a solid cylinder made of superconductive material having a nonsuperconducting segment on its side.

A segment can be cut from the superconducting cylinder as shown in FIG. 5. In this case a circular segment from the side of the cylindrical superconductor 34 is withdrawn, leaving a perforation 35 in the side of the superconducting cylinder as the field-permeable zone. When this is done a "needle" like or conical field 37 can be created that protrudes outside the external surface of the superconducting cylinder. This can be achieved in a number of different ways. The static approach, whereby the field topology is fixed is described in FIG. 5, where the magnetic field generating structure device 31 is shown. This structure consists of a support cylinder 33 on which the current bearing windings 32 are wound, a hollow superconducting cylinder 34 is positioned coaxially with the windings and outside the winding envelope. The superconducting cylinder has a circular perforation 35 on its side.

The field generating windings 32 when powered without the superconducting element 34 in place, would create a normal homogeneous field within the solenoid hollow and a rapidly decreasing field outside it. In the presence of the superconducting element 34, the outer part of the field, i.e. the outer magnetic induction, of the solenoid is compressed in the space between the inner wall of the superconducting cylinder and the solenoid winding, in a fashion as described by the field lines 36, essentially as described in connection with FIG. 1. The magnetic field within the solenoid remains essentially unmodified. In the area of the main perforation 35, the field assumes a conical form as described by the field lines 37.

The magnetic field magnitude at the point of the cone is of course much larger than the field at the same location in the absence of the superconducting cylinder, and the field is localized in space.

With appropriate modification, the superconducting structure can be made to move so as to position the conical field at any position outside of the solenoid (except the solenoid ends). For instance, the solenoid could be matched to a helical drive so as to move it to any desired position. A linear drive would be used if only a lateral movement of the field is desired.

Figure 9:
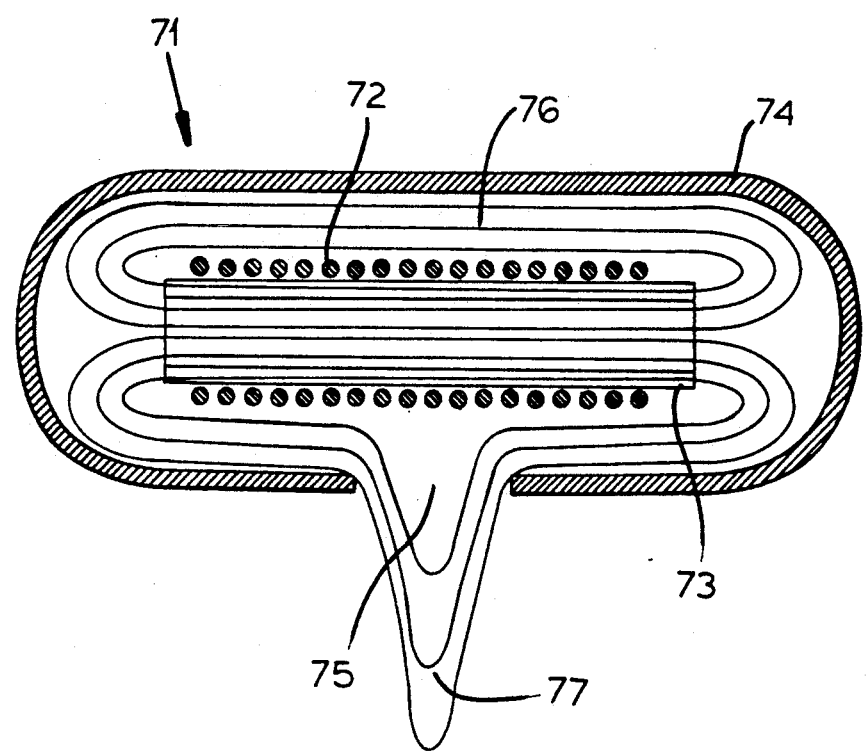
FIG. 9 is a sectional view showing another embodiment.

In some applications, the extent of the magnetic flux protrusion created may not be sufficient. This protrusion may be enhanced by using a closed end superconducting cylindrical structure as described in FIG. 9. In FIG. 9, a compound solenoid 71 has a support structure 73 on which a generally helical coil 72 is wound. This structure is enclosed within a superconductor 74 having a generally cylindrical structure with its axial ends closed and having on one of its sides a perforation 75 through which the magnetic flux is forced to protrude in a generally conical manner. It should be understood that the end superconducting elements should be relatively close to the solenoid ends to provide for the desired improvement. If the enclosing cylinder is much longer than the field generating solenoid, the effect of the end closures will be only marginal.

Such end closings are useful for accentuating field protrusions (conical and radial) when the enclosing superconducting structure in which the nonsuperconducting perforation is either fixed or created by the quenching of appropriate superconducting elements within the enclosure, and when the structure is stationary relative to its field-generating solenoid.

When using such enclosing superconducting structures, it is best to pass the end wires of the coil through holes that are coaxial with the solenoid (see FIG. 10A and 10B at 88), so as to minimize flux leakage through the wire feedthroughs.

Figure 10A:
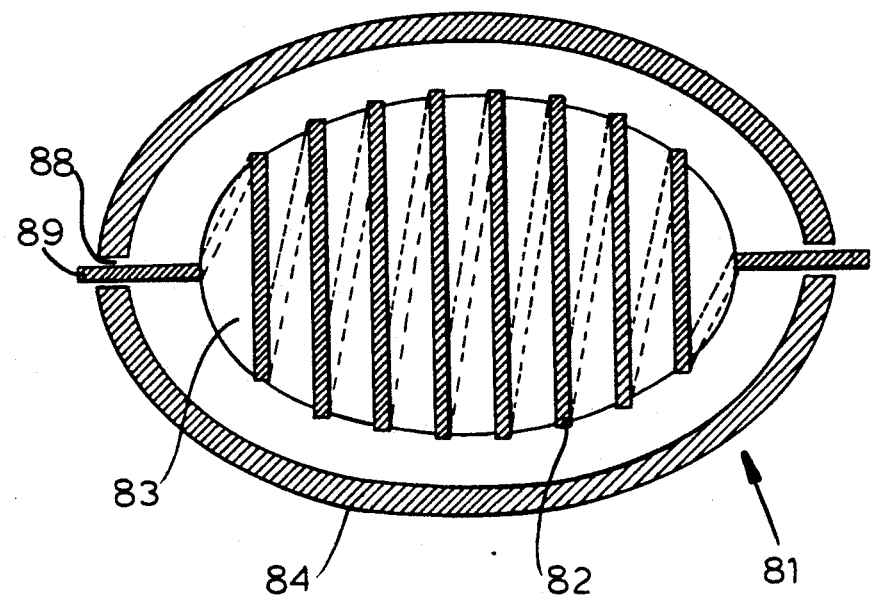
FIGS. 10A and 10B are sectional views taken at a right angle to one another of yet another embodiment.
Figure 10B:
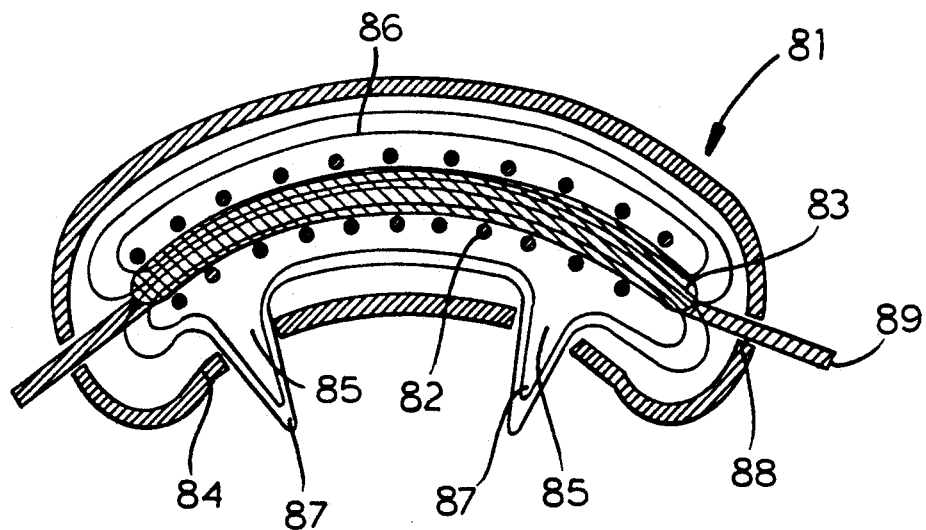

FIGS. 10A and 10B show a generalized embodiment of the instant invention. FIG. 10A depicts a section in top projection of the compound solenoid 81, and FIG. 10B a cross sectional view perpendicular thereto. The compound solenoid has a generally oval and bent shape as shown in the projection in FIG. 10A, and the cross section of FIG. 10B, and it consists of a helical coil 82 wound on a support structure 83 (which is not necessarily hollow), and is a flattened solenoid. The solenoid is enclosed within a shell in the form of superconductor 84 having a plurality of perforations 85. In areas devoid of perforations the solenoid outer magnetic flux 86 is confined between the superconducting shell 84 and the coil 82, while at the perforations 85, the magnetic flux lines 87, protrude to create magnetic field probes. The coil leads 89 are brought into the structure through small holes 88 in the superconducting shell. These holes are preferably on the axis of symmetry of the coil, where the magnetic field lines diverge, and thus minimization of field leakage occurs.

One could also pass these leads through some of the perforations 85, if these are fixed perforations in the superconductor, however, some field modification due to the current trough the wire will be present.

A field generator as described with respect to FIGS. 10A and 10B as well as other conical field protrusions extending outwardly from the solenoid can be used to apply a localized magnetic field at any well defined site without applying the same field at a neighboring site in, for example, nondestructive testing of a material in which the reaction to an applied magnetic field is measured.

E. Formation of Conical Field Intrusion Inside A Solenoid

Similar field topologies can be created within the hollow of a solenoid. For instance I can use a hollow superconducting cylinder and insert it within the hollow of a solenoid and enclose it within the solenoid windings as in FIG. 6. In this figure I show a cross section through the magnetic field forming structure 41. This structure consists of a hollow cylindrical support element 43 on which the current bearing windings 42 are wound. Within this structure there is a superconducting cylinder 44 with a generally circular perforation 45. It should be mentioned that while I described the structure 42 to be hollow (so as to facilitate the movement of a cryogenic fluid to cool the superconducting cylinder), this structure can be solid as well and made from a material having magnetic permeability close to 1. Such an embodiment may be a practical choice when the windings are made of superconducting materials as well, and thus cooling of the complete structure (including or not including the solenoid hollow) must be accommodated.

The magnetic field distribution is shown for the case when the superconducting cylinder is in the superconducting phase. Under this condition, the flux lines 46 are compressed between the windings and the superconducting cylinder in the space devoid of the perforation and they form a conical field structure 47, penetrating the hollow of the solenoid in the area of the perforation 45 in the superconducting cylinder.

This configuration can be created in a static manner by simply carving a perforation on the side of the superconducting cylinder. As described above, by appropriate modification of the dewar enclosing the superconducting cylinder, one can cause the cylinder to move, for instance by mechanical means, so as to move the conical field penetration inside the solenoid along the axis of the solenoid. Below I describe an embodiment of the instant invention allowing the electronic modulation of the field penetration described, and it should be self evident that the same techniques would apply equally to the conical field protrusions described earlier.

This inwardly directed conical field can be used to control the flow of a ferrofluid through the interior of the solenoid.

F. Controlling the Morphology of the Magnetic Field Cone

Figure 6:
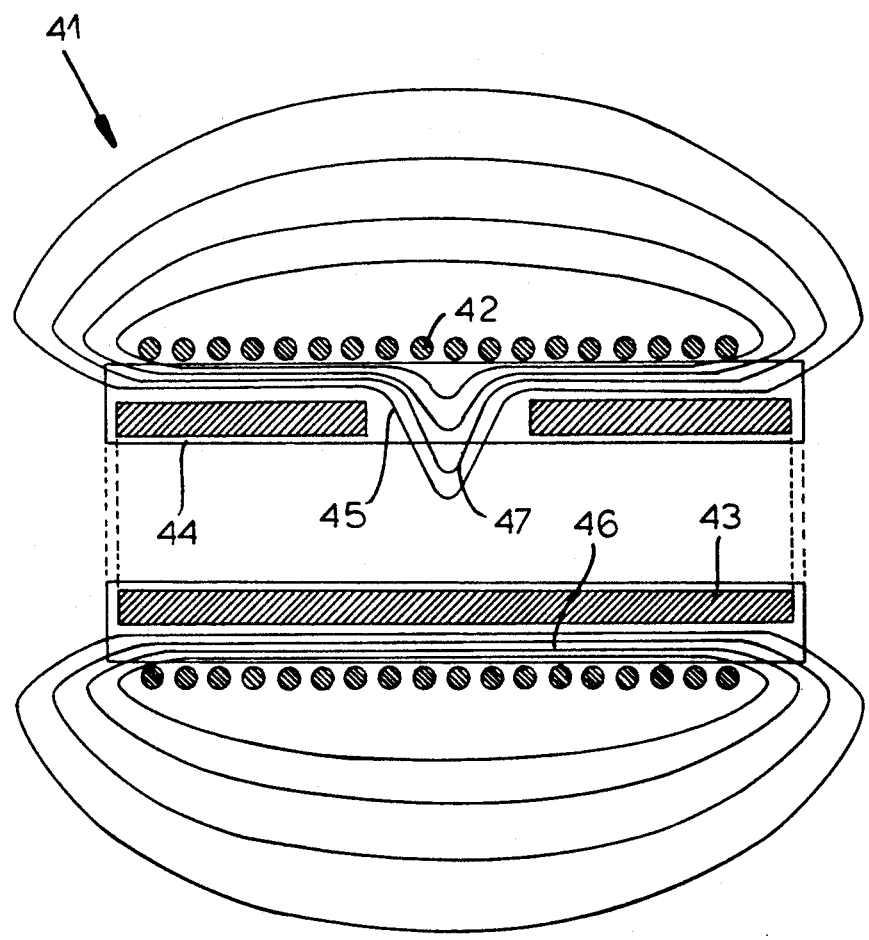
FIG. 6 is a cross section through yet another embodiment of the instant invention consisting of a normal solenoid enclosing concentrically within its winding a solid cylinder made of superconductive material having a nonsuperconducting segment on its side.
Figure 7:
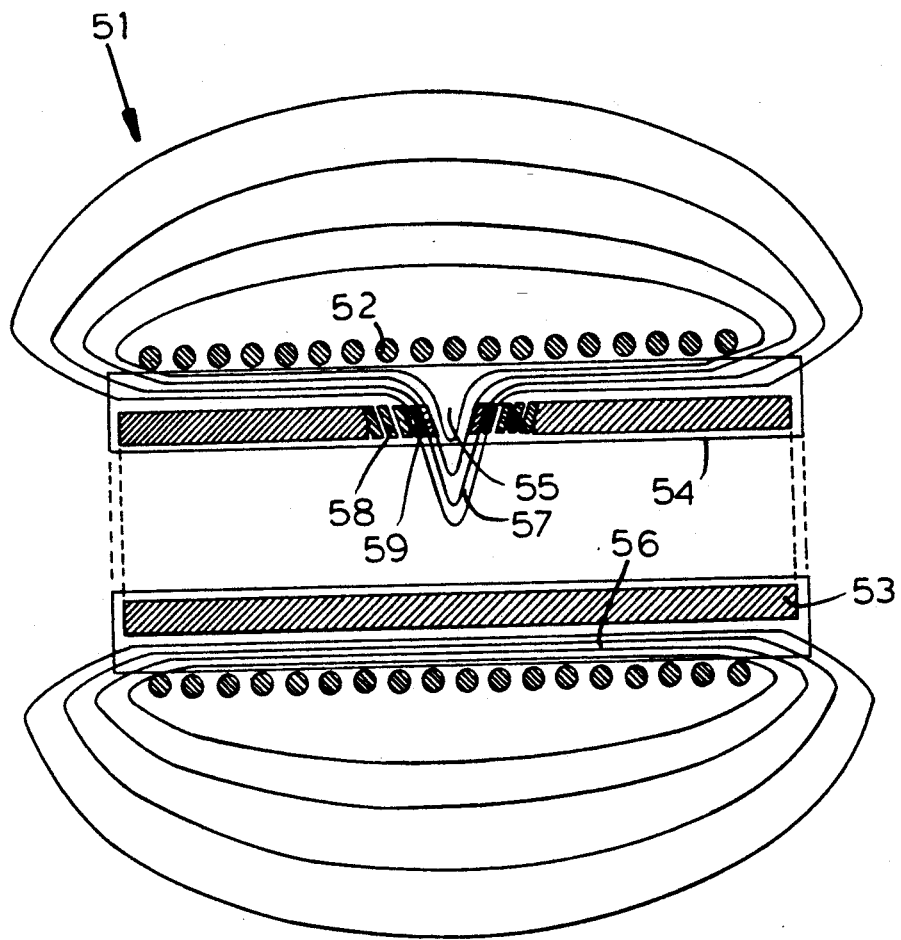
FIG. 7 is a cross section through yet another embodiment of the instant invention consisting of a normal solenoid enclosing concentrically within its windings a solid cylinder made of superconductive material having quenchable elements on of its side.

In order to control the morphology of the conical field penetration, a number of strategies can be implemented one of which is demonstrated in FIG. 7. In FIG. 7 I show the same structure depicted in FIG. 6, except that the side perforation 55 in the superconducting cylinder 54 is fitted with a number of quenchable superconducting rings 58 and 59. Actually these rings are cylindrically distorted to fit the superconductor cylinder contour. These rings are separated from each other by respective insulating layers. The rings can be produced by cutting them from a single conical structure. These rings have on opposing sides leads (not shown) through which current can be passed to force their quenching out of the superconducting state (e.g. with a controller like the controller 26 described previously). Alternative means of quenching these rings can be used in a manner analogous to the quenchable superconducting annuli described in connection with FIG. 4. In FIG. 7 I show the two internal rings, 59, quenched to the normal state and the three external rings, 58, in the superconducting state. This feature provides for some control of the depth of the conical field penetration described by the flux lines 57.

It should be obvious that when similar rings are used in the perforation 35 of the superconductor cylinder 34 in FIG. 5, that modulation of the magnetic field protrusion 37 would be possible by the judicious quenching and unquenching of these superconductor rings.

It is not necessary that the distorted rings conform to the cylindrical external surface and by the appropriate choice of the ring morphology, one can obtain a space within the magnetic field protrusion 37 (or field penetration 57 in FIG. 7), which is sufficiently large and has relatively homogeneous magnetic field.

G. Cylindrical Array

An alternative structure to yield similar results consists of an array of switchable superconducting elements assembled in the general form of the superconducting cylinders described in the various embodiments of the instant invention. A planar array was described in a co-pending application Ser. No. 07/334,584 filed 21 Mar. 1989. In that application the modulated field was, however, generally orthogonal to the surface of the array, and only minor modulation of fields coplanar with the array occurs. In the instant invention, despite the fact that the modulated field is coplanar with the proposed array, significant field modulation occur. This is a result of the unique morphology (closed magnetic line in a relatively small space) of the magnetic field created by a solenoid.

Figure 8:
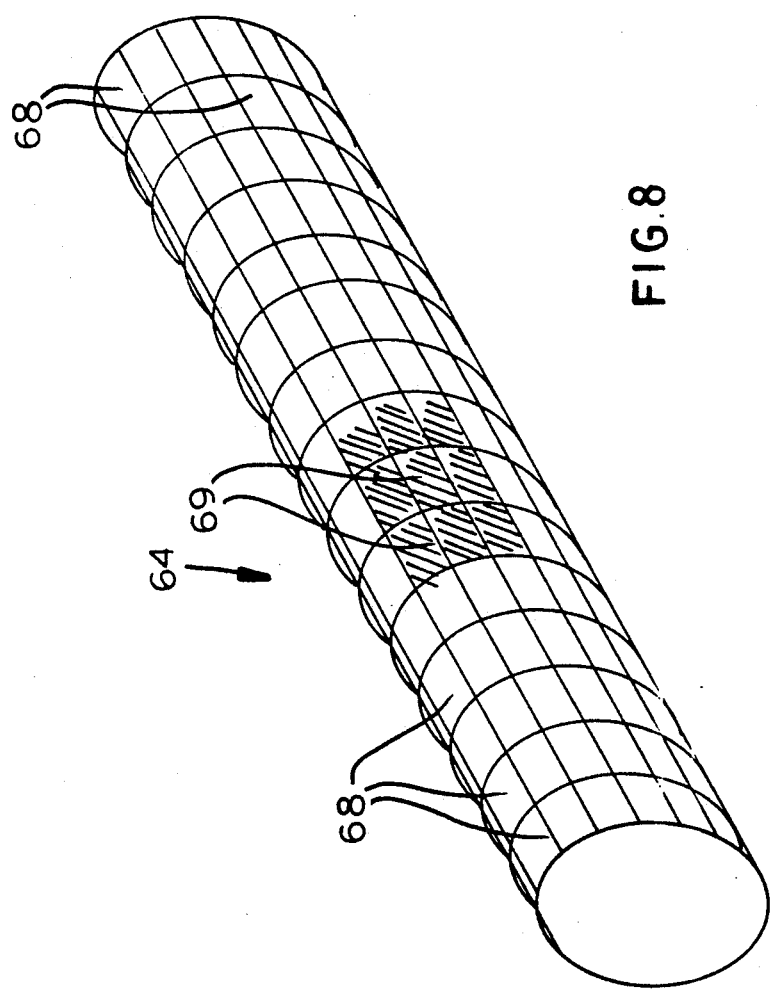
FIG. 8 is a diagrammatic perspective view illustrating another feature of the invention.

In FIG. 8 I show such an array 64 composed of superconducting elements 68. These elements are each connected to means by which they can be quenched from the superconducting state to the normal state, such means being either current leads capable of passing through the element a current exceeding the superconductor critical current (in the presence of the applied magnetic field), or heat from a small heating element embedded near each superconducting element.

This cylindrical array would take the place of the superconducting cylinder 34 in FIG. 5, when it is desired to create field protrusion morphologies outside the solenoid, or in lieu of the superconductor cylinder 44 in FIG. 6, when it is desired to obtain magnetic field intrusion within the solenoid hollow.

The modulation occurs by quenching out of the superconducting state a group of adjacent elements 69 in the array. The field pressure forces the magnetic field lines to protrude (or intrude) through the area of quenched superconducting elements in an attempt to reassume the normal magnetic field geometry of the solenoid, now constrained in some area by the unquenched superconducting elements.

Complex morphologies of field penetration (protrusions) can be obtained. This approach also allows for complete electronic positioning of the field protrusion (penetration) relative to the solenoid's exterior (interior) surface.

This approach would be used only when temporally modulated field are desired. Modulation in time of the field topology would be achieved as described above for the outer space (inner space) of the solenoid, by the judicious quenching of an appropriate group of adjacent elements, if only one conical field protrusion (intrusion) outside (within) the solenoid is desired, or, if a multiplicity of such protrusions (intrusions) are desired, by the judicious quenching of a number of groups of adjacent switchable superconducting elements.

Three general types of field topologies are associated with a cylindrically arranged array of quenchable superconductors. These are best classified by their topological progenitors. For the purpose of this description surface that are topologically equivalent can be derived from each other by stretching, compressing or bending, but without cutting out any part of the surface nor by inserting a foreign body within a void of the surface.

It should be understood that similar topological transformations on the field generating solenoids and its superconducting flux constraining, as for example, in FIGS. 10A and 10B, would result in useful field topologies.

First, when the quenched elements form a geometry which is topologically equivalent to a circle having all elements within said circle quenched, I obtain flux protrusions which are generally conical, when the cylindrical array is positioned outside the windings, and I obtain flux intrusions which are generally conical when the cylindrical array is positioned within the windings.

Second, when the quenched elements form a geometry topologically equivalent to a ring through whose hollow's passes the winding axis of symmetry (first type), the field topologies have the general form of radially emanating ridges or protrusions when the cylindrical array is outside the windings, and generally radial intrusions within the solenoid hollow when the cylindrical array is within the solenoid windings.

Third, when the quenched elements form a geometry topologically equivalent to a ring (second type) on the array's surface and the axis of symmetry does not pass through the ring hollow (namely the ring is wrapped around the cylindrical array surface), then I obtain crater like protrusions matching the morphology of the quenched elements and the arrays surface, when the array surround the windings and similar intrusions when the array is within the winding hollow.

It should be clear that a number of combinations of these topologies is feasible as well, for instance concentric quenched rings of the second type, or two rings of the first type which are coalesced into one ring on one side and split into two rings on the other side.

It should be clear that when a fixed configuration of a plurality of protrusion and/or intrusions of fields outside and in the solenoid hollow, respectively are desired, fixed inner and outer solenoid are used having preselected locations on their surfaces with the appropriate holes.

In the following I describe a unique application of this field topology which essentially creates a magnetic valve within the solenoid hollow. In this case I create a perforation which encompass most of the circumference of the cylinder except a small area where the two segment are still connected. The magnetic field intrusion will fill most of the solenoid's hollow at the breach created but little or no magnetic field flux would be present in the hollow part screened by the superconducting cylinders and near area connecting the segments. Such structures, particularly when the breach is formed from quenchable superconducting elements could find use in valving of magnetic fluids like ferrofluids or diamagnetic colloids. These structure are also important when trapping of magnetic particles from a non magnetic fluid is desired.

It should be clear to a person skilled in the art that perforation of the superconducting cylinder, whether achieved by removing part of the superconducting cylinder wall (for temporally fixed field topologies) or by the judicious quenching of adjacent superconducting elements, can assume a varied morphologies which are not necessarily symmetric. Furthermore, the main superconducting cylindrical insert can be either coaxial with the solenoid windings axis, noncoaxial but parallel to said axis or even at a small angle to said axis, to create a variety of field topologies within the solenoid hollow.

H. Additional Magnetic Field Morphologies Within a Solenoid Hollow

For completeness, I describe here magnetic field pinches within solenoids that can be modulated mechanically In U.S. Pat. No. 4,996,508, I described magnetic field pinches formed within the hollow of superconductors by the selective quenching of superconducting annuli positioned within the solenoid windings. Above I described how magnetic field protrusions of various topologies can be created outside a solenoid by segmenting a superconducting cylinder positioned to enclose the solenoid winding into a plurality of smaller adjacent cylindrical structures. I also described above how the movement of these cylindrical segments by mechanical means, either in tandem or independently of each other, provides for the temporal modulation of the field outside solenoids. It should be clear from the above discussion and the aforementioned patent that the introduction and lateral movement of a solid superconducting cylinder, segmented into a plurality of adjacent cylinders having gaps between them, and having a diameter sufficiently smaller than the solenoid's windings diameter will produce within the solenoid's hollow a fixed magnetic field topology characterized by the fact that field pinches penetrate the solenoid hollow at the locations of the said gaps, and that this topology will move along the axis with the tandem movement of the plurality of superconducting cylinder segments. It should also be clear that the independent movement of the superconducting cylinders elements relative to each other will create magnetic field pinches which vary in their topology as the gap between adjacent cylinders is changed.

It should also be clear that the gaps and perforations between and within the modifying superconducting structures described within this application can be filled with nonsuperconducting solids, particularly when fixed magnetic field topologies are desired.

It should also be clear that in lieu of using perfect cylindrical shapes for both the solenoid's windings and the superconducting cylinder, one could form valid embodiments of the instant invention in which either or both the current bearing windings and the field modifying superconducting cylinders are truncated cones or partially deformed cylindrical structures (for instance a bent hollow tube) as long as their mutual geometry is topologically equivalent to the different structures described herein.

I claim:

1. A method of generating a magnetic field with modified induction topology, comprising the steps of;
   (a) providing a coil having a predetermined coil length and formed by at least one layer of a multiplicity of generally helical turns of a conductor capable, upon energization of generating a solenoid magnetic field directed axially within said coil and having an outer magnetic field component surrounding said coil;
   (b) shaping said outer magnetic field component at least in part by:
   spacedly surrounding said coil with an annular superconductor positioned, upon being rendered superconductive, to confine said outer magnetic field component between said superconductor and said coil, and
   cooling said annular superconductor to a temperature below a critical temperature $T_c$ thereof at which said annular superconductor is rendered superconductive; and (c) passing an electric current through said coil to generate said solenoid magnetic field.

2. The method defined in claim 1 wherein said coil is subject to a hoop stress resulting from an interaction electric current from through said conductor with said magnetic field, said method further comprising the step of increasing the magnetic field induction at the outer periphery of said coil to an absolute value close to the magnetic induction on the inner periphery of said coil.

3. The method defined in claim 2, further comprising the step of mechanically bracing said annular superconductor against outwardly directed force whereby said outer magnetic field component, compressed between said annular superconductor and said coil, transfers said hoop stress to said annular superconductor.

4. The method defined in claim 1 wherein said annular superconductor defines a magnetic-field permeable zone between opposite axial ends of said coil, thereby creating an outward bulge in said outer magnetic field component at said zone.

5. The method defined in claim 4, further comprising the step of shifting said outward bulge by mechanically displacing said annular superconductor.

6. The method defined in claim 5 wherein the annular superconductor is mechanically displaced by moving said annular superconductor axially along said coil.

7. The method defined in claim 4 wherein said bulge is defined between said annular superconductor and a further annular superconductor spaced from the first-mentioned annular superconductor, said method further comprising the step of varying a shape of said outward bulge by relatively displacing the annular superconductors.

8. The method defined in claim 4 wherein said bulge is defined between said annular superconductor and a further annular superconductor spaced from the first-mentioned annular superconductor, said method further comprising the step of jointly displacing said annular superconductors to displace said outward bulge along said coil.

9. The method defined in claim 4 wherein a plurality of magnetic flux bulges are defined between a plurality of annular superconductors spaced from each other along the solenoid axis.

10. The method defined in claim 4, further comprising the step of imparting a predetermined configuration to an opening forming said zone, thereby defining a shape of said outward bulge.

11. The method defined in claim 10 wherein the opening has a form topologically equivalent to a circle on the side of the annular superconductor, creating a magnetic flux bulge topologically equivalent to a conical protrusion.

12. The method defined in claim 10 wherein the opening has a form topologically equivalent to a ring having the coils axis passing through the ring, creating a magnetic flux bulge topologically equivalent to a radial protrusion.

13. The method defined in claim 10 wherein the opening has a form topologically equivalent to a ring not having the coil axis passing through the ring, creating a magnetic flux bulge topologically equivalent to a crown.

14. The method defined in claim 4 wherein said zone is defined by a plurality of superconductor elements, further comprising the step of selectively quenching superconductivity of said elements to render said zone permeable to said outer magnetic field component and thereby form said outward bulge.

15. The method defined in claim 14 wherein the superconductor elements consist of adjacent overlapping quenchable superconductor annuli forming at least part of the first mentioned annular superconductor.

16. The method defined in claim 14 wherein the superconductor elements consist of concentric overlapping quenchable superconductor annuli forming at least part of the first mentioned annular superconductor.

17. The method defined in claim 14 wherein the superconductor elements consist of an array of adjacent overlapping quenchable superconductor elements forming at least part of the first mentioned annular superconductor.

18. The method defined in claim 4 wherein the superconductor is essentially closed at opposite ends.

19. A method of generating a magnetic field wi&h modified induction topology, comprising the steps of;

(a) providing a coil having a predetermined coil length and formed by at least one layer of a multiplicity of generally helical turns of a conductor capable, upon energization, of generating a magnetic field directed axially within said coil; and (b) shaping said magnetic field at least in part by:
  disposing within said coil an annular superconductor positioned, upon being rendered superconductive, to confine said magnetic field between said superconductor and said coil,
  forming said annular superconductor with at least one magnetically permeable zone extending over at least limited portion of a circumference of said annular superconductor to shape an inwardly directed bulge of said inner magnetic field component, and
  cooling said annular superconductor to a temperature below a critical temperature $T_c$ thereof at which said annular superconductor is rendered superconductive; and (c) passing an electric current through said coil to generate said magnetic field.

20. The method defined in claim 19 wherein said zone is formed by making an opening in said annular superconductor.

21. The method defined in claim 19 wherein said zone is formed by selectively quenching superconductivity of a plurality of nested annular superconductive elements.

22. The method defined in claim 21 wherein said elements consist of an array of overlapping quenchable superconductor annuli.

23. A magnetic apparatus with modified magnetic field topology, comprising:
  a coil having a predetermined coil length and formed by at least one layer of a multiplicity of generally helical turns of a conductor;
  means for passing an electric current through said coil to generate a solenoid magnetic field directed axially within said coil and having an outer magnetic field component surrounding said coil;
  an annular superconductor spacedly surrounding said coil and positioned, upon being rendered superconductive, to confine said outer magnetic field component between said superconductor and said coil; and
  means for cooling said annular superconductor to a temperature below a critical temperature $T_c$ thereof at which said annular superconductor is rendered superconductive.

24. The apparatus defined in claim 23 wherein said coil is subject to a hoop stress resulting from an interaction of electric current from through said conductor with said magnetic field, said apparatus further comprising means for mechanically bracing said annular superconductor against outwardly directed force whereby said outer magnetic field component, compressed between said annular superconductor and said coil, transfers said hoop stress to said annular superconductor.

25. The apparatus defined in claim 23 wherein said annular superconductor extends axially beyond said coil at least at one end of said coil.

26. The apparatus defined in claim 23 wherein said annular superconductor defines a magnetic-field permeable zone between opposite axial ends of said coil, thereby creating an outward bulge in said outer magnetic field component at said zone.

27. The apparatus defined in claim 26, further comprising means operatively connected with said annular superconductor for shifting said outward bulge by mechanically displacing said annular superconductor.

28. The apparatus defined in claim 26 wherein said bulge is defined between said annular superconductor and a further annular superconductor spaced from the first-mentioned annular superconductor, means being provided for varying a shape of said outward bulge by relatively displacing the annular superconductors.

29. The apparatus defined in claim 26 wherein said bulge is defined between said annular superconductor and a further annular superconductor spaced from the first-mentioned annular superconductor, said apparatus further comprising means for jointly displacing said annular superconductors to displace said outward bulge along said coil.

30. The apparatus defined in claim 26 wherein said zone is defined by a plurality of superconductor elements, further comprising means for selectively quenching superconductivity of said elements to render said zone permeable to said outer magnetic field component and thereby form said outward bulge.

31. An apparatus for generating a magnetic field with controlled topology, comprising:
 a coil having a predetermined coil length and formed by at least one layer of a multiplicity of generally helical turns of a conductor;
 means for passing an electric current through said coil to generate an internal magnetic field component directed axially within said coil and closed through an outer magnetic field component surrounding said coil;
 an annular superconductor disposed within said coil and positioned, upon being rendered superconductive, to confine said inner magnetic field component between said superconductor and said coil, said annular superconductor being formed with at least one magnetically permeable zone extending over a limited portion of a circumference of said annular superconductor to shape an inwardly directed bulge of said inner magnetic field component; and
 means for cooling said annular superconductor to a temperature below a critical temperature $T_c$ thereof at which said annular superconductor is rendered superconductive.

32. The apparatus defined in claim 31 wherein said zone is an opening formed in said annular superconductor.

33. The apparatus defined in claim 31 wherein said zone is formed by a plurality of nested annular superconductive elements, said apparatus further comprising means for selectively quenching superconductivity of said elements.

* * * * *